United States Patent
Jäckel et al.

(10) Patent No.: US 11,079,586 B2
(45) Date of Patent: Aug. 3, 2021

(54) MEASURING MICROSCOPE FOR MEASURING MASKS FOR LITHOGRAPHIC METHODS AND MEASURING METHOD AND CALIBRATION METHOD THEREFOR

(71) Applicant: Carl Zeiss SMT GmbH, Oberkochen (DE)

(72) Inventors: Oliver Jäckel, Jena (DE); Carola Bläsing-Bangert, Rothenstein (DE); Dirk Seidel, Jena-Leutra (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 842 days.

(21) Appl. No.: 15/461,723

(22) Filed: Mar. 17, 2017

(65) Prior Publication Data
US 2017/0269347 A1 Sep. 21, 2017

(30) Foreign Application Priority Data

Mar. 18, 2016 (DE) .......................... 102016204535.0

(51) Int. Cl.
| | |
|---|---|
| G02B 21/36 | (2006.01) |
| G03F 1/84 | (2012.01) |
| G01B 11/24 | (2006.01) |
| G01N 21/45 | (2006.01) |

(52) U.S. Cl.
CPC ........ G02B 21/365 (2013.01); G01B 11/2441 (2013.01); G01N 21/45 (2013.01); G03F 1/84 (2013.01); *G01N 2021/458* (2013.01)

(58) Field of Classification Search
CPC .......... G02B 21/365; G03F 1/84; G01N 21/45
See application file for complete search history.

(56) References Cited

U.S. PATENT DOCUMENTS

| | | | |
|---|---|---|---|
| 4,583,298 A | 4/1986 | Raugh | |
| 4,737,823 A * | 4/1988 | Bouwer | ............ G03F 7/70241 355/53 |
| 8,473,237 B2 | 6/2013 | Huebel et al. | |

(Continued)

FOREIGN PATENT DOCUMENTS

| | | |
|---|---|---|
| DE | 102008005355 | 7/2009 |
| DE | 102009016858 | 9/2010 |

(Continued)

OTHER PUBLICATIONS

M. Raugh, "Self-Calibration of Interferometer Stages: Mathematical Techniques for Deriving Lattice Algorithms for Nanotechnology", Technical Report ARITH-TR-02-01 (2002).

*Primary Examiner* — Jeremiah C Hallenbeck-Huber
(74) *Attorney, Agent, or Firm* — Fish & Richardson P.C.

(57) ABSTRACT

The present invention relates to a method for calibrating a measuring microscope which may be used to measure masks, in which a calibration mask is utilized in a self-calibration algorithm in order to ascertain error correction data of the measuring microscope, wherein, in the self-calibration algorithm, the calibration mask is imaged and measured in various positions in the measuring microscope in order to ascertain one or more portions of the error correction data, wherein the surface profile of the calibration mask is ascertained and utilized when determining the error correction. Moreover, the invention relates to a measuring microscope and a method for operating same.

11 Claims, 2 Drawing Sheets

(56) References Cited

U.S. PATENT DOCUMENTS

| | | | | |
|---|---|---|---|---|
| 8,617,774 B2* | 12/2013 | Kerwien | .................... | G03F 1/42 |
| | | | | 257/48 |
| 2010/0128278 A1* | 5/2010 | Deck | .................. | G01B 11/2441 |
| | | | | 356/477 |
| 2010/0241384 A1* | 9/2010 | Huebel | .................. | G01B 11/03 |
| | | | | 702/94 |
| 2010/0285400 A1* | 11/2010 | Inada | .................. | G03F 7/70775 |
| | | | | 430/30 |
| 2012/0162755 A1* | 6/2012 | Stroessner | ............. | G02B 5/005 |
| | | | | 359/386 |
| 2015/0198798 A1* | 7/2015 | Seitz | .................... | G02B 21/365 |
| | | | | 382/144 |
| 2019/0011690 A1* | 1/2019 | Seidel | ....................... | G03F 1/84 |

FOREIGN PATENT DOCUMENTS

| | | |
|---|---|---|
| DE | 102009019140 | 11/2010 |
| DE | 102014018510 | 6/2015 |
| WO | WO 2008/055589 | 5/2008 |

\* cited by examiner

MEASURING MICROSCOPE FOR MEASURING MASKS FOR LITHOGRAPHIC METHODS AND MEASURING METHOD AND CALIBRATION METHOD THEREFOR

CROSS REFERENCE TO RELATED APPLICATIONS

This application claims priority to German patent application 10 2016 204 535.0, filed on Mar. 18, 2016, the entire contents of which are hereby incorporated by reference.

TECHNICAL FIELD

The present invention relates to a method for measuring masks for lithographic methods by use of a measuring microscope, and a corresponding measuring microscope and a method for calibrating such a measuring microscope.

BACKGROUND

In lithographic methods for producing microstructured or nanostructured components for microelectronics or microsystems engineering, structured elements such as masks, which are also referred to as lithography masks, photomasks or reticles, are employed, said structured elements having to be positioned and produced correspondingly accurately in order to obtain the resolution of structures in the nanometer range. Apparatuses for measuring masks, as described in e.g. DE 10 2008 005 355 A1 and DE 10 2009 019 140 A1, are already known. The use of a measuring microscope is disclosed, wherein predetermined positions within the structures (structure positions) are measured in aerial images of the masks or of the structured elements.

Ascertaining the position on masks is based upon an interferometric length measurement. To this end, special adjustment marks on a mask or a structure element of the used structures of a mask are captured individually in respect of the position thereof by use of a microscopic image. The individual adjustment marks or structure elements of the mask are successively driven into the center of the image field by way of a positioning stage and the position of the respective adjustment marks or structure elements is ascertained by way of edge thresholds or by way of correlation methods. Thereupon, the distance from the adjustment mark or structure element measured previously is ascertained by determining the path traveled by the positioning stage between the measurements. The path traveled by the positioning stage is ascertained by use of an interferometric measurement.

To improve readability, use is only made of the phrase adjustment marks below. It also comprises structure elements of the used structures.

Conventionally, the position measuring apparatuses are calibrated by self-calibration methods. Here, a system of equations may be produced by recording and measuring a calibration mask at a plurality of different measurement positions, said calibration mask having a defined structure such that structure positions on the calibration mask are approximately known, the system of equations taking into account various error components in a series expansion in the individual equations, which error components may be introduced by, e.g., the stage for the masks to be measured in the measuring microscope or by the elements to be measured themselves, for example by non-exact structures on the calibration mask.

Using the quasi-redundant measurement data record, it is possible to separate position errors of the adjustment marks on the calibration mask from intrinsic errors in the position measuring apparatus. The latter are used, in turn, for the purposes of calibrating the position measuring apparatus.

Typical causes for the errors in the position measuring apparatus are, inter alia, errors in the interferometer and tilts and unevenness of the interferometer mirrors. Such errors are taken into account by the above-described calibration method.

Although it is already possible to obtain good results when measuring structured elements by way of a self-calibration of measuring microscopes using calibration masks, there is a further need for carrying out a more accurate measurement of structured elements. In particular, it is difficult to ascertain surface profiles of masks using the measuring microscopes known in the field of lithography.

SUMMARY

In a general aspect, the present invention specifies a method for measuring structured elements for lithographic methods, a corresponding measuring microscope and a method for calibrating the corresponding measuring microscope, which facilitate a more accurate measurement of structured elements. In particular, the corresponding methods and the measuring microscope should facilitate simple carrying out of the methods with, at the same time, good and accurate results, and a corresponding simple design of the measuring microscope.

Another general aspect of the invention lies in providing a method and a measuring microscope which facilitates simple ascertaining of the surface profile of a mask, which is also referred to as a topology of the mask or as a height profile.

One or more of these aspects can be achieved by a method for calibrating a measuring microscope which may be used to measure masks, in which a calibration mask is utilized in a self-calibration algorithm in order to ascertain error correction data of the measuring microscope, wherein, in the self-calibration algorithm, the calibration mask is imaged and measured in various positions in the measuring microscope, wherein the surface profile of the calibration mask is ascertained and taken into account during the calibration.

One or more of these aspects can be achieved by a method for measuring structured elements for lithographic methods, the method utilizing a measuring microscope by use of which images of the structured elements may be created, wherein the structured elements to be measured are arranged in an object plane of the measuring microscope, wherein one or more coordinates of the structured elements to be measured are captured in the direction of the optical axis of the measuring microscope, wherein the captured coordinates in the direction of the optical axis serve as a reference value and coordinates ascertained after the reference value in time and in the direction of the optical axis of the elements to be measured are corrected by means of a change in a refractive index influencing the imaging of the measuring microscope, said change having taken place during the corresponding time interval.

One or more of these aspects can also be achieved by a measuring microscope for measuring structured elements for lithographic methods, more particularly for carrying out a method for measuring structured elements for lithographic methods as described above, wherein the measuring microscope comprises a device for determining the refractive index of the medium present in the measuring microscope. Advantageous configurations are the subject matter of the dependent claims.

The invention initially proposes an improved calibration method for calibrating a measuring microscope serving to measure masks for lithography methods.

Measuring microscopes for measuring masks utilized in lithography methods need to facilitate measurements with a high accuracy. Measuring microscopes whose relative lateral measurement accuracy ranges down into the region of less than or equal to 0.5 nm are provided for the present invention.

Such measuring microscopes are calibrated accordingly, with the calibration supplying error correction data, by use of which measurement errors may be corrected accordingly. The error correction data utilized for correcting the measurement error constitute a simple correction factor for corresponding measurement data, i.e., for example, x-, y-, z-coordinates of a measurement point on the structured element to be measured, in the simplest case. Here, a correction factor may be ascertained for a multiplicity of measured coordinates of the structured elements to be measured, or individual error correction data may be ascertained in the form of a type of correction map for each measurement value, said correction map specifying the corresponding error correction data for each point on the surface of the structured element. Moreover, the error correction data may comprise not only simple correction factors but also complex correction functions which have different correction algorithms.

According to the invention, the calibration of the measuring microscope comprises a self-calibration algorithm, in which a calibration mask having defined structures is examined, in particular measured, at at least two measurement positions, preferably at a plurality of different measurement positions. By recording a plurality of images of the calibration mask at different positions and by measuring the structures of the calibration mask at known positions of the structures of the calibration mask, i.e. at known structure positions, in the recorded images, it is possible, with knowledge of the relative measurement positions of the calibration mask, to produce a system of equations which facilitates ascertaining error correction data in such a way that a high measurement accuracy is possible for the corrected measurement data, even in the case of non-exact structure positions, i.e. structures or structure positions with certain deviations. In order to improve this further, the calibration method according to the invention uses a calibration mask with a surface profile known from measurement, said surface profile also being referred to as a height profile, for the self-calibration algorithm. This measure facilitates a more accurate measurement, even in the z-direction. In particular, this facilitates a separation of the measurement error in the z-direction into error components caused by the stage and error components caused by the mask.

The surface profile is ascertained by a highly precise plane interferometer, i.e. not in the measuring microscope itself. The surface of a mask to be examined, the profile of which is ascertained, usually extends along a main surface of the mask spanned by the two largest dimensions of the structured element to be examined.

In particular, the measured surface profile may be utilized in a calibration method for measuring microscope in such a way that the surface profile, and hence the coordinates in the z-direction (z-coordinates) which constitutes the normal direction on the surface to be examined or the height direction, are introduced as known boundary conditions into the system of equations from the self-calibration process. Using this, the z-coordinates of the calibration mask may be assumed as given and, when determining the error correction data of error components of the calibration mask in the direction of the normal to the surface of the structured element or transversely or perpendicular to the main surface of the structured element, a simplification of the system of equations is possible to the extent that the z-coordinates of the calibration mask no longer need to be taken into account with unknown deviations. Since the influences of the calibration mask in the z-direction are therefore already taken into account, the remaining error to be corrected may be assigned to other influences, for example influences by errors in the stage. In other words, a subdivision of the errors into errors of the mask and errors of the stage is facilitated. Both the tilt of the mask on the stage and a wedge-shaped distortion of the mask have effects on the measurement values in the z-direction which cannot be separated from one another—without knowledge about a surface profile.

This allows an improvement in the error correction of measurement data in a direction transverse to the main surface of the structured elements, said main surface at the same time constituting the optical axis of the measuring microscope when the measuring microscope is applied, and the corrected measurement data have a higher measurement accuracy.

The measurement error when determining z-coordinates of a structured element, such as a mask, in a direction transverse to the imaged object plane may therefore be significantly reduced, and so, after a calibration according to the invention, a reliable determination of the z-coordinates of a structured element to be measured or of a mask is also possible. This also applies, in particular, for cases which usually occur in measuring microscopes, namely that the calibration by use of a calibration mask in the self-calibration algorithm is only carried out at those measurement positions of the calibration mask in which the calibration mask is moved in an xy-plane, i.e. transversely to the optical axis of the measuring microscope, for example by a rotation about an axis parallel to the optical axis of the measuring microscope or by a corresponding translational movement along the x- and y-direction, and/or that the measurement of a structured element likewise occurs with an orientation of the surface to be measured transversely to the optical axis or to the z-direction.

For defined ascertaining of the surface profile of the calibration mask, the calibration mask may be arranged on a three-point bearing, which may likewise be provided in the measuring microscope for measuring structured elements for lithography processes. By way of a suitable three-point bearing, it is possible to avoid influences by errors in the bearing plane, such as, e.g., unevenness or the like, and/or by errors on the rear side of the elements to be measured, such as, e.g., likewise unevenness or the like.

The mask may be borne on a so-called stage or holder with a horizontal alignment. Usually, a corresponding stage comprises three bearing points, on which the mask is borne. Gravitational forces act on the mask as a result of the horizontal arrangement, and so there is bending of the mask, the so-called "mask sacking". However, as a result of the bending of the mask, there are, in the case of transmission in the direction of the optical axis, different focal positions, distributed spatially across the mask, or the lithographically relevant surface or topography may have deviations from an intended position in the z-direction, i.e. in the direction of the optical axis during imaging. This may lead to problems when illuminating and imaging the mask.

Since the bending of the mask or the deviation of the lithographically relevant topography in the z-direction from an intended position, depending on the material of the mask and the design of the mask, is unavoidable, the bending of the mask is taken into account and the imaging settings are adapted accordingly.

Moreover, the bending of the calibration mask on account of the gravitational force in the case of horizontal bearing may be taken into account when determining the surface profile, as described in, for example, DE 10 2014 018 510 A1. Moreover, the bending may also be ascertained by a simulation, for example by a finite element simulation, and the ascertained bending may be subtracted from the z-coordinates ascertained by interferometric measurement in order to take into account the bending.

Further, a compensation of a change in the refractive index of the air as a result of density changes or temperature variations may be provided when measuring the calibration mask. To this end, the measuring microscope may comprise a device for determining the refractive index of the medium in which the measuring microscope is operated. Air is usually considered as medium.

An interferometer may be utilized for determining the refractive index, said interferometer measuring a constant distance in the measuring microscope such that changes in the refractive index by way of variations in the medium become capturable.

The influence of the refractive index may be compensated in such a way that the structured element to be measured, i.e., for example, the calibration mask, is interferometrically measured at a reference time at at least one point, preferably at a plurality of points, of the surface to be measured, for example at the points of the surface to be measured corresponding to the bearing points of the three-point bearing, such that a distance from a measuring objective of the measuring microscope, i.e. a z-coordinate of the surface to be measured, is ascertained. The refractive index of the medium of the measuring microscope, which serves as a reference value, is likewise ascertained at the reference time. In subsequent measurement recordings of the measuring microscope by use of the measuring objective, the distance from the structured element to be imaged and to be measured to the measuring objective is corrected in accordance with the change in the refractive index at the measurement time in comparison with the reference time.

This method for compensating the refractive index may be utilized not only in the calibration method but also in a method for measuring structured elements in a measuring microscope such that, in accordance with a further aspect of the present invention, protection is requested for such a method, both independently and also in combination with other aspects of the present invention. Moreover, a method for measuring structured elements may also comprise a calibration method according to the first aspect of the present invention.

DETAILED DESCRIPTION

Further advantages, characteristics and features of the present invention will become clearer in the following detailed description of the exemplary embodiments. However, the invention is not restricted to these exemplary embodiments.

Figure 1:
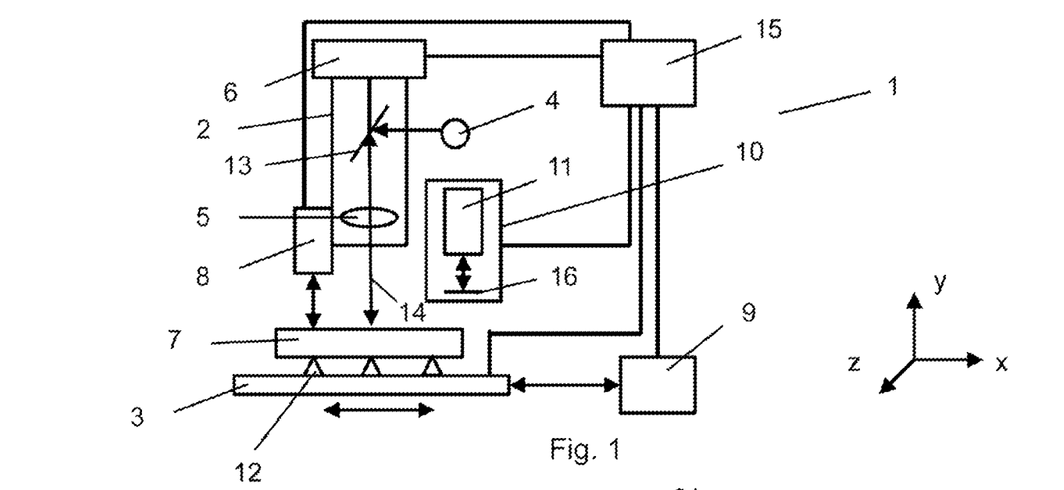
FIG. 1 shows an illustration of a measuring microscope according to the present invention.

In a purely schematic illustration, FIG. 1 shows a measuring microscope 1 for measuring structured elements, such as, e.g., photomasks (with or without a pellicle). The measuring microscope 1 comprises a microscope body 2, in which a measuring objective 5 is arranged. Moreover, the measuring microscope 1 comprises a light source 4, by use of which it is possible to illuminate a structured element 7 arranged on a stage 3. The light source 4 radiates the illumination light 14 toward the element 7 to be examined by way of a beam splitter 13 in the microscope body 2, with the illumination light 14 reflected by the element 7 to be examined being imaged in a detector 6 such that the element 7 to be examined may be recorded in the detector with reflected-light illumination. By way of example, the detector 6 may be a CCD camera, by use of which an image of the element 7 to be examined may be captured.

The mask 7 to be examined is placed onto a three-point bearing 12 on the stage 3, with the stage being movable in three independent spatial directions. Here, the mask 7 is borne on hemisphere-shaped elements. These may be applied directly on the stage. In one variant, these may also be applied to a mask holder; then, the mask is placed onto the mask holder and the mask holder is placed onto the stage. The stage 3 may be moved both in a plane transverse to the optical axis (which corresponds to the illustration of the illumination light in FIG. 1) of the measuring microscope 1 and in a direction perpendicular thereto. Accordingly, the movement of the stage 3 may be carried out in three independent spatial directions, corresponding to the Cartesian coordinate system in the x-, y- and z-directions. The movements in the x-direction and in the y-direction take place within the plane perpendicular to the optical axis, while the movement in the z-direction extends in the direction of the optical axis.

The stage (7) is only displaceable in the xy-plane in one variant of a measuring microscope (1). The measuring optical unit 5 is displaceable in the z-direction. A calibration may then be carried out in the same way as in the case of the stage which is displaceable in all directions.

The positioning of the mask 7 in the xy-plane by use of the stage 3 may be ascertained by way of one or more interferometers 9.

Figure 3:
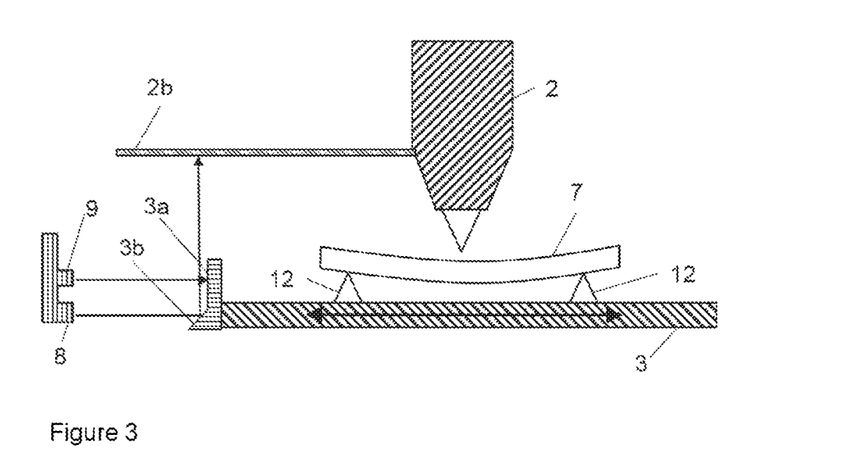
FIG. 3 shows an illustration of a measuring microscope with the measurement of the position of the stage and of the objective by way of an interferometer.

At least two interferometers are utilized for ascertaining the position of the stage 3 in the xy-plane. FIG. 3 shows, as an example, an interferometer 9 with the corresponding interferometer mirror 3a fastened to the stage 3.

At least one further interferometer 9 is provided for ascertaining the position of the stage in the z-direction. The interferometer beam is diverted to a z-mirror 2b by way of a deflection mirror 3b fastened to the stage 3. The z-mirror 2b is fastened to the microscope body 2 and perpendicular to the z-axis.

Moreover, the measuring microscope 1 comprises a device 10 for determining the refractive index of a medium, e.g. the air, present in the measuring microscope. The device 10 for determining the refractive index likewise comprises an interferometer 11 which ascertains the distance from a fixedly installed mirror 16 such that changes in the refractive index of the medium, for example as a result of changes in air pressure or variations in temperature, may be ascertained.

The various measuring devices, such as, e.g., the detector 6, the device 10 for ascertaining the refractive index, the interferometers 8, 9 and/or devices with drives and/or actuators, such as the stage 3, are connected to a control and regulating device 15 comprising an evaluation unit, and so desired information items may be ascertained from the ascertained measurement data and at least parts of the measuring microscope 1 may be controlled accordingly on the basis of these information items.

Images of the elements 7 to be measured may be recorded by way of the detector 6 and corresponding distance measurements or position measurements may be carried out by way of the interferometers 8, 9.

A mask 7 is measured in such a way that, initially, the element 7 to be examined is borne on the three-point bearing 12, with the lateral positioning, i.e. the positioning within the xy-plane, of the element 7 to be examined being carried out by corresponding interferometer measurements using the interferometer 9 or using corresponding further interferometers which are not shown in FIG. 1.

Thereupon, one or more images of the elements 7 to be examined are captured using the detector 6 and the positions of the elements to be examined may be ascertained from the one or more images, which may be recorded at the same position and/or different positions of the mask to be measured.

In addition to the position of a structure feature in the xy-plane, it is also possible to ascertain the position in the z-direction. A distance is set between the surface of the mask 7 and the objective in such a way by displacing the stage 3 in the z-direction or by displacing the objective 5 that the structure element to be imaged comes to rest in the best focal plane.

A reference system is used to specify the coordinates of the measured positions. It may consist of three markings on the mask, for example three markings in three of the corners of a square mask. Initially, the x-, y-, and z-positions of these markings are measured. These markings then define a mask coordinate system, in which the positions of the structure elements are specified. It is also possible to apply three markings to the stage 3. Then, the x-, y-, and z-positions of these markings are measured. These markings define a machine coordinate system. Then, the positions of the structures are specified in this coordinate system.

In a further variant, the position of a special plane is ascertained as a reference system in the z-direction. The z-position of the mask 7 is measured at those positions on the mask 7 at which the latter is borne on points of the three-point bearing 12. This plane defined by the ascertained z-values of the surface of the mask 7 is used as a reference plane.

The measuring microscope is calibrated for the purposes of achieving measurements with a high accuracy. The error correction for the x-, y-, z-coordinates may be carried out on account of the error correction data obtained during the calibration of the measuring microscope, wherein a corresponding error correction may be predetermined for each x-, y-, z-coordinate. The error correction data may also contain error correction values for correcting a multiplicity of x-, y-, z-coordinates.

Figure 2:
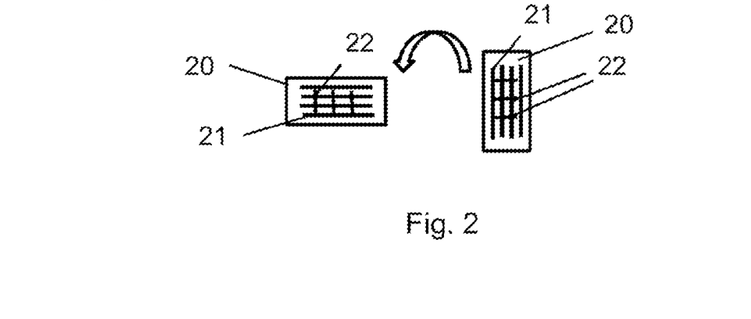
FIG. 2 shows a plan view of a calibration mask at two different measurement positions within the scope of the self-calibration algorithm.

For calibration purposes, use is made of a calibration mask 20 with predetermined structures 21. A calibration mask 20 is produced like a conventional mask by way of an electron beam writer (mask writer). The errors of the resulting calibration masks occurring in the process are so large that the desired accuracy during measurements with the measuring microscope cannot be obtained by a direct calibration using a calibration mask 20.

Hence, a self-calibration algorithm is used, in which, as depicted in FIG. 2, a calibration mask 20 with predetermined, defined structures 21 is imaged and measured at at least two measurement positions. FIG. 2 depicts two measurement positions, in which the mask 20 is rotated through an angle of 90° about the z-axis. The structure of the calibration mask 20 comprises an orthogonal grid made of equidistant points. Details in respect of the used method for self-calibration are disclosed in the laid-open application document WO2008/055589. A corresponding method is also disclosed in the patent document U.S. Pat. No. 4,583,298.

A system of equations for various predetermined positions 22 on the calibration mask may be constructed from images of the calibration mask 20 in the various measurement positions, said images facilitating the elimination of the residual error of the positions 22 on the calibration mask 20. The system of equations for ascertaining the error correction data comprises a multiplicity of equations for the positions 22 of the structure 21 of the calibration mask, wherein the error correction values for correcting the x-, y-, z-coordinates may be represented by series expansions. The series expansions comprise various parts for compensating different influences which, for example, may be assigned to the influences of the mask and of the mask holder.

In order to obtain reliable values for correcting the z-coordinates, when ascertaining the error correction data from different positions of the calibration mask 20, the surface of the calibration mask 20 is, according to the invention, additionally measured interferometrically, such that a surface profile of the calibration mask may be created.

The surface profile is ascertained by a plane interferometer. By way of example, use is made of a Tropel FlatMaster appliance or, in particular for masks, the appliance called Tropel UltraFlat, both made by Corning Inc. & Tropel Metrology Systems.

Figure 4:
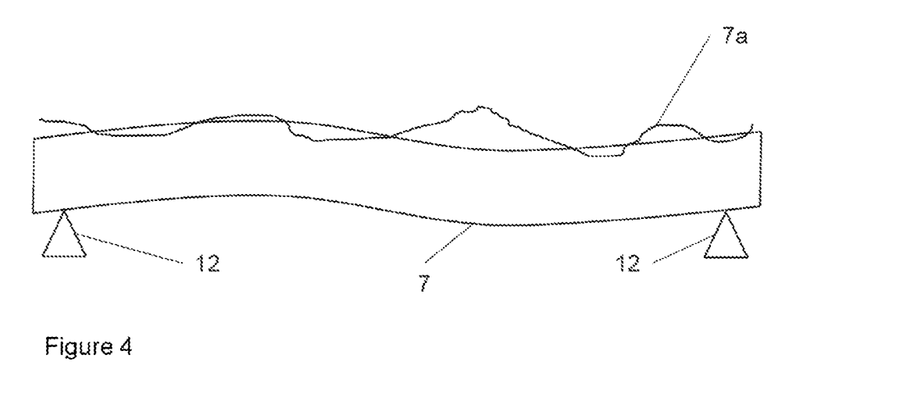
FIG. 4 shows a lateral section of an illustration of a mask with a surface profile.

The surface profile measured by use of an interferometer is additionally corrected by the bending of the calibration mask caused by the gravitational force during the interferometer measurement, for the purposes of which use is made of a finite element simulation of the bending. An example of a surface profile 7a of a mask 7 is shown schematically in a longitudinal section in FIG. 4.

The surface profile of the calibration mask 20 ascertained thus may then be predetermined as a boundary condition when ascertaining the error correction data. As a result, it is possible to carry out a reliable correction of the z-coordinates ascertained when measuring a mask 7 such that the measurement method for measuring the mask to be measured may also be reliably applied to determining the z-coordinates of the element to be measured. Hence, ascertaining surface profiles of masks using a measuring microscope is facilitated.

The stage 3 is calibrated by a method of self-calibration. The method is described in detail in the laid-open application document DE 10 2009 016 858 A1. Here, and below, the terms reproducibility and accuracy relate to the reproducibility and accuracy with which the position of the stage is known. As a rule, these are better than the reproducibility and accuracy with which the stage may be deliberately moved to a predetermined position.

One and the same calibration mask is measured multiple times with the stage for the purposes of the self-calibration of the error in the position of the stage (referred to as stage error below), wherein said stage is displaced or twisted in the second iteration and in the further iterations in relation to the first iteration. A single one of these iterations is referred to as calibration position below, the measurement of a predetermined marking in an iteration is referred to as individual measurement, and the totality of all measurements is referred to as a calibration sequence. The stage error depending on the stage position should be calculated from the measurement results.

For the purposes of carrying out the method according to the invention, the stage is calibrated in all three dimensions.

In one variant of the calibration, the assumption is made to a good approximation that both the stage (including the bearing points for the calibration mask) and the calibration mask itself behave like a rigid body. Deformations within the scope of the measurement accuracy may not occur either when displacing the stage or when repositioning the calibration mask from one calibration position to the next. Further assumptions about the stage and calibration mask are not required. Further, more accurate calibration methods are possible.

The position-dependent stage error may be described with the aid of a function system, the free parameters of which are intended to be ascertained by the calibration ("stage parameters"). The relationship between the stage parameters and the stage error should be linear:

$$\begin{pmatrix} f_x(t_x, t_y, t_z) \\ f_y(t_x, t_y, t_z) \\ f_z(t_x, t_y, t_z) \end{pmatrix} = \underline{K}(t_x, t_y, t_z) \cdot \begin{pmatrix} \lambda_1 \\ \vdots \\ \lambda_R \end{pmatrix} \quad (1)$$

The x-stage error $f_x$, y-stage error $f_y$ and z-stage error $f_z$ as continuous functions of the stage position ($t_x$, $t_y$, $t_z$) are linked to the stage parameters $\lambda_1$ to $\lambda_R$ by way of the matrix K. The matrix embodies the selected function system and therefore depends on approached stage positions $t_x$, $t_y$ and $t_z$. The stage parameters may be non-local (e.g. polynomial coefficients) or else local, i.e. identical to x-, y- or z-components of the stage error on a predetermined discrete grid of stage positions. In this case, K is an interpolation matrix from this stage grid to the entire displacement region.

The coordinates ($x_{Pq}$, $y_{Pq}$, $z_{Pq}$) of the adjustment marks (q=1, 2, . . . , Q) are connected to the measured stage coordinates by way of the carried out translations and rotations of the calibration mask. In the case of the three-dimensional calibration, the relation is as follows:

$$\begin{pmatrix} x_S \\ y_S \\ z_S \end{pmatrix} = R_z(\psi_z) \cdot \begin{pmatrix} x_{Pq} \\ y_{Pq} \\ z_{Pq} \end{pmatrix} + \begin{pmatrix} r_x \\ r_y \\ r_z \end{pmatrix} \quad (2)$$

The coordinates of the calibration mask of the adjustment marks need not be known in advance; their values are likewise ascertained by the calibration ("calibration mask parameters").

A linear system of equations is constructed for stage parameters and calibration mask parameters by virtue of exploiting the fact that, according to the assumptions above, the actual coordinates of the adjustment marks may be calculated from the measured coordinates thereof by way of adding the stage error. In three dimensions, the relation is as follows:

$$\begin{pmatrix} mx_{S1}^{(1)} \\ mx_{S2}^{(1)} \\ \vdots \\ mx_{SN}^{(M)} \\ my_{S1}^{(1)} \\ my_{S2}^{(1)} \\ \vdots \\ my_{SN}^{(M)} \\ mz_{S1}^{(1)} \\ mz_{S2}^{(1)} \\ \vdots \\ mz_{SN}^{(M)} \end{pmatrix} = \begin{pmatrix} x_{S1}^{(1)} \\ x_{S2}^{(1)} \\ \vdots \\ x_{SN}^{(M)} \\ y_{S1}^{(1)} \\ y_{S2}^{(1)} \\ \vdots \\ y_{SN}^{(M)} \\ z_{S1}^{(1)} \\ z_{S2}^{(1)} \\ \vdots \\ z_{SN}^{(M)} \end{pmatrix} + \begin{pmatrix} f_x(t_{x1}, t_{y1}, t_{z1}) \\ f_x(t_{x2}, t_{y2}, t_{z2}) \\ \vdots \\ f_x(t_{xN}, t_{yN}, t_{zN}) \\ f_y(t_{x1}, t_{y1}, t_{z1}) \\ f_y(t_{x2}, t_{y2}, t_{z2}) \\ \vdots \\ f_y(t_{xN}, t_{yN}, t_{zN}) \\ f_z(t_{x1}, t_{y1}, t_{z1}) \\ f_z(t_{x2}, t_{y2}, t_{z2}) \\ \vdots \\ f_z(t_{xN}, t_{yN}, t_{zN}) \end{pmatrix} \quad (3)$$

Here, $mx_{Si}^{(J)}$, $my_{Si}^{(J)}$ and $mz_{Si}^{(J)}$ denote the x-, y- and z-measurement value for the stage coordinates of the i-th individual measurement. The superscript index J refers to the associated calibration position and runs from 1 up to the number M of measured calibration positions. On the right-hand side, the first vector contains the actual stage coordinates $x_{Si}^{(J)}$, $y_{Si}^{(J)}$, $z_{Si}^{(J)}$ or the adjustment marks, which are indexed according to the same system, while the second vector contains the x- and y-components of the stage error at the stage position ($t_{xi}$, $t_{yi}$), which was approached at the i-th individual measurement. The equations (1) and (2) and (3) correspond to the equations with the same numbers from the aforementioned laid-open application document DE 10 2009 016 858 A1, but are specified for the three-dimensional case.

By inserting equations (1) and (2) into (3), a linear system of equations in the stage parameters and calibration mask parameters is obtained. According to the usual assumptions, the rotations of the stage are not taken into account; only the rotation $\psi_z$ about the z-axis of the calibration mask is taken into account. For the purposes of the three-dimensional calibration, the matrix K also depends on the z-translations of the calibration mask ($r_z^{(J)}$) and of the stage ($t_{zi}$):

$$\begin{pmatrix} mx_{S1}^{(1)} \\ mx_{S2}^{(1)} \\ \vdots \\ mx_{SN}^{(M)} \\ my_{S1}^{(1)} \\ my_{S2}^{(1)} \\ \vdots \\ my_{SN}^{(M)} \\ mz_{S1}^{(1)} \\ mz_{S2}^{(1)} \\ \vdots \\ mz_{SN}^{(M)} \end{pmatrix} = \underline{K}(\psi_z^{(J)}, r_x^{(J)}, r_y^{(J)}, r_z^{(J)} t_{xi}, t_{yi}, t_{zi}) \cdot \begin{pmatrix} \lambda_1 \\ \vdots \\ \lambda_R \\ x_{P1} \\ \vdots \\ x_{PQ} \\ y_{P1} \\ \vdots \\ y_{PQ} \\ z_{P1} \\ \vdots \\ z_{PQ} \end{pmatrix} \quad (4)$$

The linear system of equations (4) is resolved for the parameter vector, as result of which the stage error is known in the form of the parameters $\lambda_1$ to $\lambda_R$, as are the positions ($x_{Pq}$, $y_{Pq}$) of the adjustment marks relative to one another. In the case of an overdetermined system of equations, the Gaussian method of least squares errors is applied in order to ascertain the solution parameters within the meaning of the best fit.

In order to ensure that the system of equations (4) is not underdetermined, it is necessary to measure a consistent set of calibration settings which contains the required information. It is only the zero point of the coordinate system (=translations in x and y) and an absolute stage scale which cannot be ascertained, in principle, by a self-calibration.

For the purposes of precisely setting the scale, it is additionally necessary to use a calibration mask with mark positions which are precisely known in advance. For the purposes of setting the scale in the z-direction, use is made according to the invention of a calibration mask with a known surface profile. In respect of details, reference is made to the publication M. Raugh, "Self-Calibration of Interferometer Stages", Technical Report ARITH-TR-02-01 (2002).

Further systematic errors are taken into account when carrying out the calibration. In particular, the tilting of a mask or a wedge-shaped distortion of the mask, as is described in DE 10 2009 016 858 A1.

The uncorrected measurement or intended values are used for the parameters of the matrix K, i.e. stage positions and calibration mask positions, in a first iteration. Once a first approximation of the stage parameters $\lambda_1$ to $\lambda_R$ has been found by resolving the system of equations, the solution may be improved iteratively. The method may be expended to a calibration sequence with a plurality of calibration masks in an obvious manner; in this case, additional parameters $x_{P1}, \ldots y_{PQ(\Omega)}$ are introduced with each calibration mask $\Omega$.

A refractive index compensation may be realized in the evaluation unit of the control and/or regulating device 15 by way of the device 10 for determining the refractive index.

The refractive index of the medium of the measuring microscope 1, which is usually air, is likewise ascertained and stored at the same time in order to be able to determine subsequent changes in the refractive index in relation to this reference time.

Moreover, it is possible to carry out a correction in respect of the focal position of the element to be measured in relation to the measurement objective in view of a change in the refractive index at different measurements since the device 10 for determining the refractive index ascertains the refractive index continuously and stores this in a memory unit of the control and/or regulating device.

The compensation of refractive index changes, which may be carried out with the device 10 for determining refractive index, may be used both in the calibration method for the measuring microscope, in which a calibration mask is imaged and measured at various positions, and in the actual measurement of structured elements.

Here, the z-coordinate is ascertained interferometrically at one or more positions of the structured elements to be measured, i.e. of the calibration mask or a photomask to be measured, and the current refractive index is determined and stored at the same time by use of the device 10 for determining the refractive index. The z-coordinates of the surface of the element to be measured ascertained thus then serve as a reference for subsequent measurement recordings using the measuring microscope and for determining z-coordinates, wherein a change in the refractive index in relation to the temporally subsequent determination of the z-coordinates may be compensated for as the device 10 for determining the refractive index determines a change in the refractive index and the actual change in the refractive index may be taken into account accordingly when ascertaining the z-coordinates. Expressed differently, this means that in accordance with the time interval within which the element to be measured has been imaged in relation to capturing the reference value of the z-coordinates, the change in the refractive index is ascertained in this time interval and the ascertained z-coordinates are corrected by this change in the refractive index.

In some implementations, instructions for carrying out the calculations and processing of data described above can be stored in a computer-readable medium. The various calculations and the processing of data can be performed by, e.g., one or more data processors in the measuring microscope 1.

In some implementations, the measuring microscope 1 can include one or more processors and one or more computer-readable media (e.g., RAM, ROM, SDRAM, hard disk, optical disk, and flash memory). The one or more processors can perform various calculations and processing of data described above. The calculations and processing of data can also be implemented using application-specific integrated circuits (ASICs). The term "computer-readable medium" refers to a medium that participates in providing instructions to a processor for execution, including without limitation, non-volatile media (e.g., optical or magnetic disks), and volatile media (e.g., memory) and transmission media. Transmission media includes, without limitation, coaxial cables, copper wire, fiber optics and free space. The memory can include any type of memory, such as RAM, ROM, SDRAM, and flash memory.

The features described above can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, e.g., general purpose microprocessors, special purpose microprocessors, digital signal processors, single-core or multi-core processors, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM, DVD-ROM, and Blu-ray BD-ROM disks. The processor and the memory can be supplemented by, or incorporated in, ASICs (application-specific integrated circuits).

Even though the present invention was described in detail on the basis of exemplary embodiments, it is clear to a person skilled in the art that the invention is not restricted to these exemplary embodiments but that, instead, individual features may be omitted or different types of combinations of features may be realized as long as the scope of protection of the attached claims is not departed from. The present disclosure includes all combinations of the presented individual features.

What is claimed is:

1. A method for measuring structured elements for lithographic methods, said method utilizing a measuring microscope by use of which images of the structured elements can be created, wherein the structured elements to be measured are arranged in an object plane of the measuring microscope,
wherein one or more coordinates of the structured elements to be measured are captured in the direction of an optical axis of the measuring microscope, wherein an interferometric measurement is carried out for the purpose of capturing the coordinates in the direction of the optical axis by an interferometer having a z mirror being perpendicular to the optical axis,
wherein the captured coordinates in the direction of the optical axis serve as a reference value and coordinates ascertained after the reference value in time and in the direction of the optical axis of the elements to be measured are corrected by use of a change in a refractive index influencing the imaging of the measuring microscope, said change having taken place during the corresponding time interval,
wherein the method for measuring structured elements is utilized in a self-calibration algorithm in which a calibration mask is imaged and measured in various positions in the measuring microscope, wherein the surface profile of the calibration mask measured in a measuring appliance which differs from the measuring microscope is ascertained and taken into account during the calibration, and/or
wherein use is made of an error correction ascertained in a method for calibrating the measuring microscope in which a calibration mask is utilized in a self-calibration algorithm in order to ascertain the error correction data of the measuring microscope, wherein, in the self-calibration algorithm, the calibration mask is imaged and measured in various positions in the measuring microscope, wherein the surface profile of the calibration mask measured in a measuring appliance which differs from the measuring microscope is ascertained and taken into account during the calibration.

2. The method according to claim 1, wherein the measuring microscope comprises a device for determining the refractive index of the medium present in the measuring microscope.

3. The method of claim 1 in which the calibration comprises at least one, or more, parts for compensating mask influences and at least one, or more, parts for compensating influences of the stage, wherein the part or parts for compensating mask influences in the direction of the mask surface are correlated with the surface profile.

4. The method of claim 1 in which a tilt of the mask or a wedge-shaped distortion of the mask is taken into account as a part of the stage during the calibration.

5. The method of claim 1 in which the method for measuring structured elements is utilized in a self-calibration algorithm in which a calibration mask is imaged and measured in various positions in the measuring microscope, wherein the surface profile of the calibration mask is ascertained and taken into account during the calibration,
wherein the calibration comprises at least one, or more, parts for compensating mask influences and at least one, or more, parts for compensating influences of the stage, wherein the part or parts for compensating mask influences in the direction of the mask surface are correlated with the surface profile.

6. The method of claim 1 in which the method for measuring structured elements is utilized in a self-calibration algorithm in which a calibration mask is imaged and measured in various positions in the measuring microscope, wherein the surface profile of the calibration mask is ascertained and taken into account during the calibration,
wherein a tilt of the mask or a wedge-shaped distortion of the mask is taken into account as a part of the stage during the calibration.

7. The method of claim 1 in which the method for measuring structured elements is utilized in a self-calibration algorithm in which a calibration mask is imaged and measured in various positions in the measuring microscope, wherein the surface profile of the calibration mask is ascertained and taken into account during the calibration,
wherein the bending of the mask on account of the bearing thereof is taken into account during the determination by way of simulation when determining the surface profile of the calibration mask.

8. The method of claim 1 in which the method for measuring structured elements is utilized in a self-calibration algorithm in which a calibration mask is imaged and measured in various positions in the measuring microscope, wherein the surface profile of the calibration mask is ascertained and taken into account during the calibration,
wherein the calibration mask is borne on a three-point bearing when determining the surface profile.

9. A method for measuring structured elements for lithographic methods, said method utilizing a measuring microscope by use of which images of the structured elements can be created, wherein the structured elements to be measured are arranged in an object plane of the measuring microscope,
wherein one or more coordinates of the structured elements to be measured are captured in the direction of the optical axis of the measuring microscope,
wherein the captured coordinates in the direction of the optical axis serve as a reference value and coordinates ascertained after the reference value in time and in the direction of the optical axis of the elements to be measured are corrected by use of a change in a refractive index influencing the imaging of the measuring microscope, said change having taken place during the corresponding time interval, and
wherein the method for measuring structured elements is utilized in a self-calibration algorithm in which a calibration mask is placed at various positions relative to the measuring microscope, the calibration mask is moved among the various positions relative to the measuring microscope, at each of the various positions the calibration mask is imaged and measured in the measuring microscope, and
wherein a surface profile of the calibration mask is ascertained and taken into account during the calibration, and the surface profile of the calibration mask is ascertained by measuring the calibration mask in a measuring appliance which differs from the measuring microscope.

10. The method of claim 9 in which the self-calibration algorithm comprises:
moving the calibration mask to a first position relative to the measuring microscope,
imaging and measuring the calibration mask while the calibration mask is at the first position, moving the calibration mask to a second position relative to the measuring microscope, the second position being different from the first position, and imaging and measuring the calibration mask while the calibration mask is at the second position.

11. The method of claim 9 in which a tilt of the mask or a wedge-shaped distortion of the mask is taken into account as a part of the calibration.

\* \* \* \* \*